United States Patent [19]
Davis et al.

[11] Patent Number: 5,589,777
[45] Date of Patent: Dec. 31, 1996

[54] CIRCUIT AND METHOD FOR TESTING A DISK DRIVE HEAD ASSEMBLY WITHOUT PROBING

[75] Inventors: Bradley K. Davis, Meridian, Id.; Johannes O. Voorman, Geldrop; Joao N. V. L. Ramalho, Eindhoven, both of Netherlands; Patrice Gamand, Douvres-la-delivrande, France

[73] Assignees: Hewlett-Packard Company, Palo Alto, Calif.; Philips Electronics N.V., Netherlands

[21] Appl. No.: 493,384

[22] Filed: Jun. 21, 1995

[51] Int. Cl.$^6$ .................... G01R 31/02; G01R 31/302
[52] U.S. Cl. .................... 324/537; 324/210; 324/763; 324/764; 369/53
[58] Field of Search .................... 324/210, 212, 324/537, 538, 546, 763, 764, 691, 713; 360/46, 67; 369/53, 55; 371/22.5, 22.6; 29/593; 364/481–483, 580

[56] References Cited

U.S. PATENT DOCUMENTS

| | | | |
|---|---|---|---|
| 3,681,682 | 8/1972 | Cox et al. | 324/546 X |
| 5,087,884 | 2/1992 | Brannon | 324/212 X |
| 5,285,948 | 2/1994 | Rupp et al. | 324/210 X |
| 5,392,172 | 2/1995 | Yoshinga et al. | 360/67 |
| 5,438,273 | 8/1995 | Gergel et al. | 324/546 |
| 5,457,381 | 10/1995 | Farwell | 324/763 X |

*Primary Examiner*—Gerard R. Strecker
*Attorney, Agent, or Firm*—Lane R. Simmons

[57] ABSTRACT

A preamplifier circuit for a computer data storage system disk drive read/write head (or HSA) includes multiple test modes to enable electrical testing of the preamplifier, the read/write heads, and associated circuitry without physically probing the components or circuitry. Communication between the preamplifier and a host controller provides for test mode selection and test mode enablement within the preamplifier. Testing occurs using only the normal interface connector to the head disk assembly (HDA) in which the preamplifier and HSA are embodied. Properties such as electrical resistance, ESD, preamplifier bond wire connection integrity, head bond wire and solder joint integrity, and connections from the head slider to the preamplifier leads are all tested. Testing occurs without probing to provide efficient, reliable, and cost effective manufacturing and testing benefits of the read/write heads, flex assembly, HSA, and HDA.

20 Claims, 1 Drawing Sheet

5,589,777

CIRCUIT AND METHOD FOR TESTING A DISK DRIVE HEAD ASSEMBLY WITHOUT PROBING

FIELD OF THE INVENTION

This invention relates to computer data storage systems and, in particular, to a device and method for testing the electrical integrity of a disk drive read/write head assembly and associated circuitry.

BACKGROUND OF THE INVENTION

Computer data storage systems that employ disk drives have conventionally used a single, electrically inductive head for reading and writing data to and from the disk. More recently, it has been known to use one or more magnetoresistive (MR) head elements for reading and an inductive head element for writing. Obviously, regardless of the type of head element employed, the quality and reliability of such head components are critical to data storage systems. As such, read/write heads and associated circuitry may be subject to specific electrical testing during the manufacturing process to identify and weed out defective units, as well as improve the manufacturing and handling process.

Prior methods of testing read/write heads have been to physically probe the heads with test contacts after manufacture to determine whether they have the proper electrical characteristics. For example, probe testing identifies improper head element resistance, determines electrical continuity, open circuits, short circuits, and can identify electrostatic discharge (ESD) damage. Often, however, testing is only performed after completion of the manufacturing process and after a failure has occurred because probe testing such fragile and electrically sensitive components during the manufacturing process is difficult and time consuming.

On a conventional inductive, single read/write head, only two wires are associated with the head for electrical connection and testing purposes. However, in more recent data storage systems employing dual MR read heads and/or multiple heads in head stack assemblies (HSA), a significant number of more wires and electrical connections exist and thus the difficulty of testing the heads and the care with which testing must occur is compounded. Probe testing such systems can easily cause head element damage or peripheral circuitry damage.

On the one hand, testing must be reliable and efficient to avoid excessive testing costs and to improve manufacturing production flows, product quality, and product reliability. On the other hand, it is extremely important that testing be performed carefully to avoid sensitive head damage. However, conventional methods of testing read/write head elements and associated circuitry has not afforded a means for cost effective testing during the manufacturing process. Accordingly, objects of the present invention are to provide an improved system and method for testing disk drive read/write head elements and connecting circuitry.

SUMMARY OF THE INVENTION

According to principles of the present invention in its preferred embodiment, a preamplifier circuit for a disk drive read/write head (or HSA) includes multiple test modes to enable electrical testing of the preamplifier, the read/write heads, and/or associated circuitry without physically probing the components or circuitry. Communication between the preamplifier and a host controller provides for test mode selection and test mode enablement within the preamplifier.

Testing occurs using only the normal interface connector to the head disk assembly (HDA) in which the preamplifier and HSA are embodied. Properties such as electrical resistance, ESD, preamplifier bond wire connection integrity, head bondwire and solder joint integrity, and connections from the head slider to the preamplifier leads are all tested. Testing occurs without probing to provide efficient, reliable, and cost effective manufacturing and testing benefits of the read/write heads, flex assembly, HSA, and HDA.

Other objects, advantages, and capabilities of the present invention will become more apparent as the description proceeds.

DETAILED DESCRIPTION OF THE INVENTION

Figure 1:
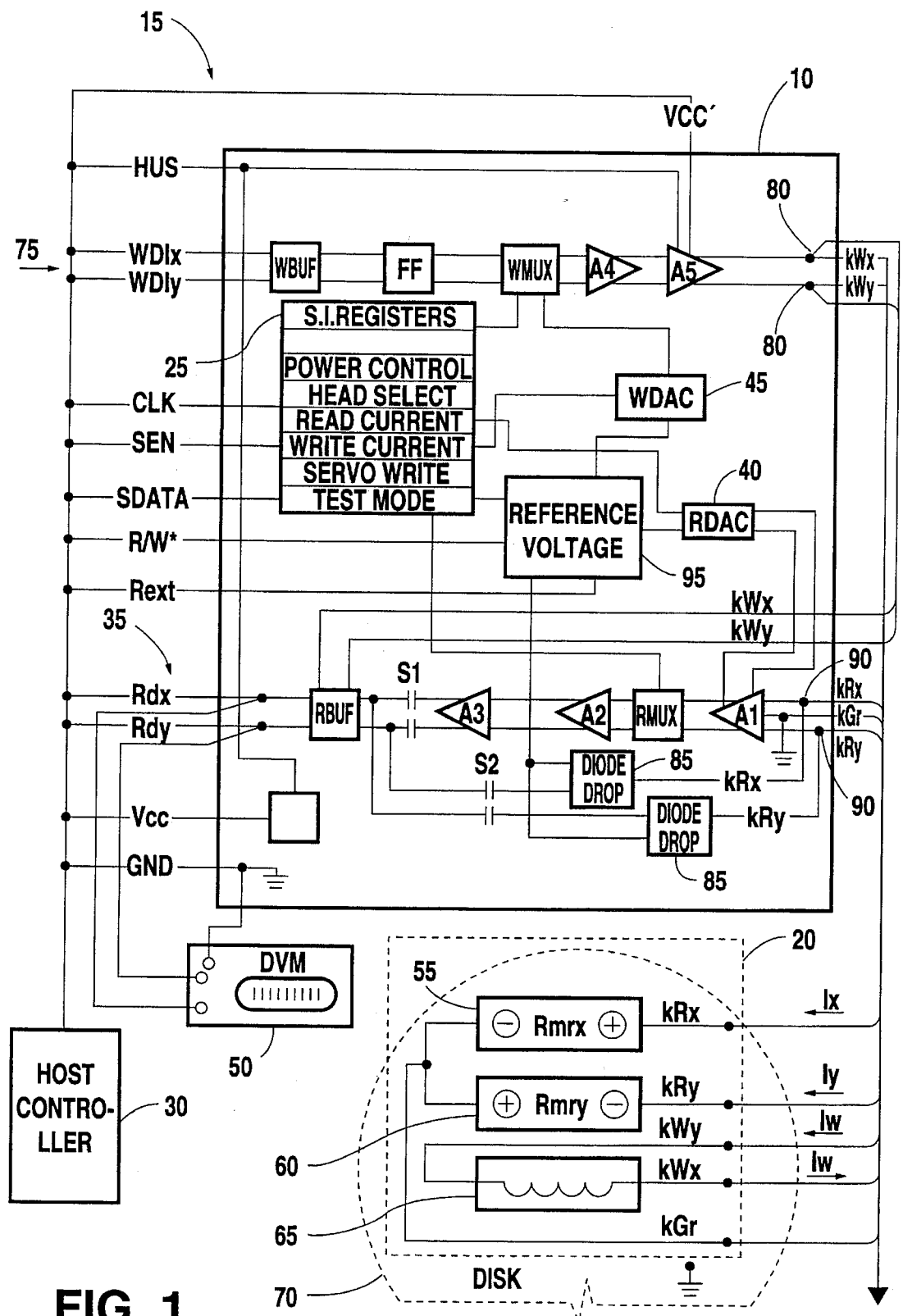
FIG. 1 is a block diagram of the present invention preamplifier test circuit and system.

FIG. 1 represents a block diagram of the present invention preamplifier test circuit 10 and system 15 for testing a computer data storage system disk drive read/write head 20 (or HSA) and associated circuitry without physically probing the components or circuitry. The system includes preamplifier 10, read/write head 20, host controller 30, and voltmeter (or multimeter) means 50. The preamplifier circuit 10 includes serial interface memory registers 25 which are used for enablement of multiple test modes for electrical testing of preamplifier 10, read/write heads 20 (or HSA), and/or associated connecting circuitry.

Typically, preamplifier 10 is electrically attached to a flexible or rigid printed wiring substrate (not shown), often referred to as a flex assembly. Circuit lines embodied in the flex assembly communicate between preamplifier 10 and an external connection, such as a conventional 24 pin connector. An advantage of the present invention is that not only does testing occur without probing but also without increasing circuit lines in the flex assembly. Specifically, testing occurs using the existing flex assembly and external interface connection components.

Where electrical functions and connections are described in this disclosure, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is, therefore, intended to include components which are in electrical communication despite intervening components.

Preamplifier 10 has a serial input means which includes: (1) registers 25 for receiving and storing predetermined digital signals, including a test mode signal indicative of the preamplifier being placed in a selected test mode, and (2) a serial communication interface signal line SDATA connected to host controller 30 for transmitting the predetermined digital signals, including the test mode signal, to registers 25.

Preamplifier 10 also has an output means shown generally at 35, including signal lines Rdx and Rdy, for presenting an output signal referenced with respect to selected test circuitry in response to a test current applied. In the instant case, the output signal will be referred to as a voltage. However, the output signal could just as easily be modified to be a current, or a representation of voltage or current (for example, in a digital format).

Inputs to serial interface registers 25 include: CLK, the bus clock; SEN, serial bus enable; and SDATA, serial bus data. Programmed instructions from SDATA designate addressing and control of the various registers 25 for correct receipt and use of appropriate data over the SDATA signal line. In a preferred embodiment, memory registers 25 include, but are not limited to, the following designated uses:

Power Control—for selection of multiple power modes for preamplifier circuit 10, such as sleep, standby, active, and test. For example, in sleep mode, all circuits are inactive with the following exceptions: the serial interface, the circuit that forces the data registers of the serial interface to their default states at power-up, and the circuit that fixes the DC level of Rdx-Rdy, which is required when operating with more than one amplifier to common Rdx-Rdy lines. In standby mode, the current consumption is below 1 mA. Transients from standby mode to active mode are two to three orders of magnitude shorter than from sleep to active. All amplifiers can be quickly switched from standby mode to active mode, and all head switch times can be kept almost as short as in the case of operation with a single amplifier in active mode. Active mode is either the read mode or write mode as determined by R/W* signal line.

Head Select—for selection of which read/write head device to be used and/or tested; for example, which read/write head device in a head stack assembly (HSA) employing multiple read/write head devices.

Read Current—designates the current applied to the read head for normal read operations and for specific testing of the read head and associated circuitry during test mode operations.

Write Current—designates the current applied to the write head for normal write operations and for specific testing of the write head and associated circuitry during test mode operations.

Test Mode—designates the preamplifier is in test mode and also designates the selected test to be performed; namely, the test mode identifies which circuitry is selected for testing purposes, such as specific circuitry in the preamplifier itself, the read/write heads, and/or any connecting associated circuitry.

Table 1 shows examples of the various serial stream data bit configurations for using registers 25 and for enabling testing according to the present invention. Although eight (8) bits are used in this example, it is obvious that variations of the number of bits used could likewise be implemented. However, as shown, bits 0–4 are data bits indicative of a specific functional use in one of the specified plurality of registers 25 that is addressed by bits 5–7 in the serial stream. For example, a serial bit stream of "110xx100" indicates that the Test Mode register identified by address "110" (bits 5–7) is set with data bits "xx100" (bits 0–4). This serial bit configuration identifies the functional test labeled Analog Head Test Active which, in this case, defines the read/write heads as the selected circuitry to be tested.

TABLE 1

| REGISTER | ADDRESSES | | | DATA | | | | | REMARKS/MODE |
|---|---|---|---|---|---|---|---|---|---|
| | 7 | 6 | 5 | 4 | 3 | 2 | 1 | 0 | |
| Power Control | 0 | 0 | 1 | x | x | x | 1 | 1 | Active Mode (Write or Read) |
| Head Select | 0 | 1 | 0 | x | 1 | 0 | 0 | 1 | Head H9 Selected |
| Test Mode | 1 | 1 | 0 | x | x | 0 | 0 | 0 | Not in TEST Mode |
| Test Mode | 1 | 1 | 0 | x | x | 0 | 0 | 1 | Digital Test Active |
| Test Mode | 1 | 1 | 0 | x | x | 1 | 0 | 0 | Analog Head Test Active |
| | | | | | | 0 | 1 | 0 | |
| Test Mode | 1 | 1 | 0 | x | x | 1 | 1 | 0 | Read Amplifier Test Active |
| | . | . | . | . | . | . | . | . | |
| | . | . | . | . | . | . | . | . | |
| Read Current | 0 | 1 | 1 | d4 | d3 | d2 | d1 | d0 | lmr = ½ * (10 + 16 * d4 + 8 * d3 + 4 * d2 + 2 * d1 + d0) |
| Write Current | 1 | 0 | 0 | d4 | d3 | d2 | d1 | d0 | lwr = (20 + 16 * d4 + 8 * d3 + 4 * d2 + 2 * d1 + d0) | x = Don't care.

Essentially, in response to any functional test mode signal received and identified in Test Mode register 25, a controlled test current is initiated in the selected circuitry to be tested. Specifically, a digital control word held in the appropriate Read or Write Current register is converted to an appropriately controlled analog test current through respective digital to analog converter (DAC) circuitry—namely, through read digital to analog converter (RDAC) 40, or write digital to analog converter (WDAC) 45, respectively. The resultant analog signal is then multiplexed to the selected test circuitry, and the voltage referenced across the selected circuitry (at terminals 80 kWx and kWy, or 90 kRx and kRy, respectively) is multiplexed and presented at output terminals 35, Rdx and Rdy.

As part of test system 15 of the present invention, a voltmeter 50 or similar circuitry senses the voltage at output terminals 35 for determining an electrical property with respect to the selected circuitry based on the voltage signal sensed. Although voltmeter 50 is shown, it is obvious that similar circuitry or other means (such as a multimeter) could be equally embodied within preamplifier 10, host controller 30, or some other environment to detect and provide necessary measurements. The electrical properties of the selected test circuitry that are determined by testing with preamplifier test circuit 10 and/or test system 15 include, but are not limited to, electrical resistance, continuity, electrostatic discharge damage, bond wire connection integrity, solder joint integrity, and peripheral circuitry connection integrity.

Although FIG. 1 shows read/write head 20 having dual magnetoresistive (MR) read head elements 55 and 60, and single inductive write head element 65, the present invention is equally applicable for testing any conventional disk drive read/write head configuration or other applicable circuitry. For example, the present invention could easily be adapted (with obvious modifications) to test a single inductive read/write head, or a single MR read head in conjunction with a single inductive write head. Furthermore, although the FIGURE shows a separation between dual read head elements 55 and 60, they are actually only nanometers apart so they can read a common disk bit. Moreover, disk 70 is shown in phantom for reference purposes only and is indicative of any conventional disk drive (or platter) that is accessed by read/write head 20.

Although read/write head 20 shows only one read/write head assembly, the present invention is equally applicable to an HSA which, typically, includes "k" plurality of heads 20, each adjacent to its respective disk. Accordingly, with respect to each connecting signal line, the "k" prefix (i.e., kRx, kRy, kGr, kWx, and kWy) is used for indicating which of the "k" plurality of read/write elements 20 in the HSA is being used or tested. Specifically, the read head connections are kRy, kRx, and kGr, and the write head connections are kWx and kWy.

Before further identifying the more specific test functions and methods of the present invention, it should be noted that the input/output signals of preamplifier 10 include but are not limited to the following:

HUS is a head unsafe signal for inhibiting read and write signal functions to the heads when the heads are unsafe for activity.

WDIx and WDIy are differential write data input signals.

CLK, SEN, and SDATA are as previously described.

R/W* is for read/write selection, where a "high" signal is "read" mode and a "low" signal is "write" mode.

Rext. is a nominal 10 k Ohm external resistor, mounted on the flex assembly supporting preamplifier 10, and its value depends on the particular application.

Rdx and Rdy are the normal "read" output signals. However, in a test mode (as identified through Test Mode register 25), the voltage signal referenced across the circuitry selected for test purposes (such as the read/write heads) is multiplexed out to Rdx and Rdy for analysis and determination of electrical properties associated with that test circuitry.

Vcc is the supply voltage, such as a conventional five (5) volts.

GND is the preamplifier ground signal.

Vcc' is a 5–12 volt supply to write driver A5.

The key internal components of preamplifier 10 in write circuit 75 include a write buffer WBUF, a flip-flop FF for selectively reversing the write polarity, a multiplexor WMUX, and amplifiers A4 and A5 for transmitting write signals to write head element 65.

The typical electrical component and operating parameters of preamplifier 10 relevant to the read/write head test mode are listed in TABLE 2.

TABLE 2

| PARAMETER | VALUE AND UNITS | | |
|---|---|---|---|
| | MINIMUM | NOMINAL | MAXIMUM |
| supply voltage, Vcc | 4.5 | 5 | 5.5V |
| write driver voltage, Vcc | 5 | 12 | 13.2V |
| read element resistance, Rmr | 15 | 20 | 30Ω |
| Rmr mismatch (between elements) | | <15% | |
| head lead resistance, Rs | 0 | 2 | 4Ω |
| head lead inductance, ls | 0 | 20 | 50 nh |
| read element voltage, Vmr | | <0.5V | |
| differential signal, dVmr | 0.4 | 0.8 | 2 mV |
| write element + lead inductance, Lh' | 0.1 | 0.2 | 0.5 μh |
| write element + lead resistance, Rh' | | 16Ω | |
| write element + lead capacitance, Ch' | | <5 pf | |
| read element current, Imr = Ix = Iy | | 5 to 20.5 ma | |
| read element current, step size | | 0.5 ma | |
| write element current, Iw | | 20–51 ma | |
| write element current, step size | | 1 ma | |

Read and write currents are controlled and regulated by an on-chip generated, temperature-stable, reference voltage 95 (1.3V, approximately), which is available at pin Rext. This voltage is dropped across an external resistor (10 k Ohm) to form a reference current for the read head bias currents, Ix and Iy, and the write head bias currents Iw.

The read current RDAC is programmed through the serial interface Read Current register 25 according to the formula:

$$Ix=Iy=\tfrac{1}{2}(10\ kOhm/Rext)(10+16*d4+8*d3+4*d2+2*d1+d0)mA,$$

where d4–d0 are data bits (either 0 or 1) in the Read Current register (see Table 1). At "power up" all bits are set to 0, which results in a default read current of 5 mA. The adjustable range of the read currents (5 mA–20.5 mA) is centered around an offset value to increase the resolution for the given number of bits.

The write current magnitude is programmed by Write Current register 25 and, similarly, controlled through the on-chip WDAC and the reference voltage Rext. The write current programming is described by:

$$Iw=(10\ kOhm/Rext)(20+16*d4+8*d3+4*d2+2*d1+d0)mA,$$

where d4–d0 are bits (of value 0 or 1) in the Write Current register (see Table 1). The adjustable range of the write current (20 mA–51 mA) is centered around an offset to increase the resolution for the given number of bits. At power up, all bits are set to zero, corresponding with an initial write current Iw of 20 mA.

MR read head elements 55 and 60 are labeled $^{\ominus}Rmrx^{\oplus}$ and $^{\oplus}Rmry^{\ominus}$, respectively. The $\oplus$ and $\ominus$ symbols are used to indicate that these resistor elements are differentially connected. These elements are also non-linear devices. A magnetoresistive effect is a change in resistance (of a current carrying device) that occurs when acted on by a magnetic field. An increase in magnetic field may cause either an increase or a decrease in element resistance, depending on the element configuration. In the case of the two MR read elements shown, one element increases in resistance while the other decreases in resistance in response to an applied current.

Owing to the symmetry of the dual read head elements 55 and 60 (dual-stripe) arrangement, even-order harmonics are suppressed. The read bias currents, Ix and Iy, which are generally equal for each head, are also programmed to further reduce nonlinear distortion with a maximized read signal.

Normal Operation

Under normal operating (non test) conditions for preamplifier 10, Test Mode register 25 is disabled as described in Table 1. This mode enables the preamplifier to perform its normal functions for the specified Power Control mode, whether it be active, standby, or sleep mode, respectively. A brief description of normal preamplifier operation is included here to more fully recognize that, in the preferred embodiment, the novel test aspects of the present invention are included as an enhancement to normal read/write head preamplifier functions.

Relative to normal read/write operations, when Power Control register 25 is in write, standby, or sleep mode, the read circuitry is at least partially deactivated. Similarly, when Power Control register 25 is in read, standby, or sleep mode, the write circuitry is at least partially disabled.

In read mode (R/W*="high"), the write circuitry is inactive to limit power while reading, and the selected read head is connected to a multiplexed low noise read amplifier A1. A programmable current Ix,Iy (defined by Read Current register 25) is forced through the selected MR read head 55 and 60. The read amplifier A1 has a low impedance input kRx-kRy and a low-impedance output Rdx-Rdy.

Ambient magnetic fields from disk 70 adjacent to MR read elements 55 and 60 result in a relative change in the MR resistance, dRmr/Rmr. This change produces a current variation dImr=Imr*dRmr/Rmr, where Imr is the bias current in the MR element. The current variation is amplified to form the read data output signal voltage, which is available via closed switch S1 at Rdx-Rdy. Switch S2 is open in normal operation.

The ratio dRmr/Rmr, and in the ideal case the output voltage, is independent of the geometry of the MR stripe. In practice, however, imperfections, such as series resistances in the connections to the MR stripes and in the leads between the MR elements and the amplifier, and also the non-zero input resistance of the amplifier, make it less than the ideal case.

In write mode (R/W*="low"), the "read" circuitry is inactive, or at least partially inactive, to limit power while writing. A programmable current Iw (defined by Write Current register 25) is forced through the selected two-terminal inductive write head 65. The push-pull output drivers A4 and A5 yield near rail-to-rail voltage swing for fast current polarity switching.

Test Operation

In a departure from normal operation, Test Mode register 25 identifies various test modes for testing selected circuitry to which preamplifier 10 is connected. The test modes can be used during various manufacturing operations related to the read/write heads, flex assembly, HSA, and HDA for testing purposes. Three exemplary test modes (see Table 1) are Digital Test Active, Analog Head Test Active, and Read Amplifier Test Active. Although it is not the intent of this disclosure to identify all potential test modes, it is the intent to identify and describe the fact that multiple test modes are identifiable using Test Mode register 25, and each test mode describes specific, selected circuitry for testing purposes according to principles of the present invention.

For example, in Digital Test Active mode, the data received into registers 25 through the SDATA serial input line is verified for accuracy of receipt.

As another example, in Read Amplifier Test Active mode, a read amplifier such as A1 is tested for conformance to its electrical properties. Namely, the output of first stage read amplifier A1 is connected directly (not shown) to RBUF and Rdx-Rdy, bypassing the second and third stage amplifiers, A2 and A3, which are made inactive. The operation of the first stage amplifier A1 is then checked for electrical properties such as common mode voltage, coupling capacitor leakage, bandwidth, and frequency response.

Although almost any circuitry could be selected for test purposes under principles of the present invention, specific testing functions and methods are detailed here with respect to read/write heads 20. However, it is obvious and understood that testing of any other selected circuitry under a respective test mode follows similar principles to testing of the read/write heads and associated circuitry as described herein.

As shown in Table 1, the Analog Head Test Active mode identifies that a read/write head element is to be tested. As previously discussed, in normal (non test) operation, analog read data is passed back to a drive electronics board in host controller 30 through a flex assembly connector on lines Rdx and Rdy. However, during this Analog Head Test Active operation, diagnostic signals from the selected read/write head test circuitry are multiplexed to output connectors Rdx and Rdy. Specifically, voltage levels of terminals 90 (kRx, kRy) and 80 (kWx, kWy), which connect to the heads 20, are multiplexed to Rdx and Rdy to be monitored externally by monitoring device 50 or the like.

Similar to normal read/write head operations, test mode operation requires the R/W* signal to fit the test mode. Namely, for testing of read heads 55 and 60, R/W* must be "high", and for testing of write head 65, R/W* must be "low".

While in read mode (R/W* pin high), the DC voltage at the positive (non-center-tap) side of kRx and kRy of MR elements 55 and 60 of the active head 20 is buffered, level shifted up, and present at outputs Rdx and Rdy. While in write mode (R/W* pin low), the DC voltage across terminal pins 80 kWx and kWy of inductive write element 65 of the active head 20 is also buffered, level shifted down, and present at outputs Rdx and Rdy. By selecting different active heads (channels) of the preamplifier using Head Select register 25, all connections and voltage levels can be determined for the entire heads, preamplifier, and host controller interface.

In this head test mode, read/write head element currents Ix, Iy, and Iw are separately controlled by their respective programmable Read/Write Current registers 25 (as shown in Table 1) and RDAC and WDAC. By varying these current levels Ix, Iy, and Iw, various electrical properties can be determined, such as resistance of the head elements, continuity of the connecting circuitry, and integrity of solder, bondwire, and lead connections.

When a test mode is initiated through Test Mode register 25 to test the MR read head elements 55 and 60, switch S2 is closed and S1 opened, and the controlled test current (programmed through Read Current register 25) is passed through each read element 55 and 60. The resulting read currents Ix and Iy create the voltages at kRx and kRy which are not amplified in test mode through A1–A3, but are presented at Rdx and Rdy with a voltage level shift of approximately 1.4 volts. The level shift is accomplished by a pair of transistors in each of the diode drop circuits 85 in series with switch S2.

Testing of write head element 65 is performed similar to testing of read head elements 55 and 60. Namely, in response to the test mode signal initiated through Test Mode register 25, a controlled current (programmed through Write Current register 25) is passed through write head element 65 and the differential voltage that occurs at terminals 80 kWx and kWy is presented at output terminals 35 Rdx and Rdy.

Typically, however, electrical properties are determined by programming a first current through the selected circuitry and reading the respective voltage at Rdx and Rdy, and then programming a second current through the selected circuitry and reading the respective voltage at Rdx and Rdy. The resistance can be determined from a measurement of $\Delta V/\Delta I$ or $(V_1-V_2)/(I_1-I_2)$ by accounting for and subtracting effects of other parasitic resistances from $(V_1 14\ V_2)/(I_1-I_2)$. For example, if the first read current level $I_1$ were set at a current Ix=Iy=5 mA, the second read current level $I_2$ could be Ix+$\Delta$Ix where $\Delta$Ix is any value between 0.5 and 15.5 mA in 0.5 mA increments (Ix=5 to 20.5 mA), and the measured voltages would be $V_1$ and $V_2$, respectively. In a similar manner, if the first write current value were set at $I_1$=20 mA, the second current level $I_2$ could be Iw+$\Delta$Iw where $\Delta$Iw is any value between 1 and 31 mA in 1 mA increments (Iw=20 to 51 mA). In both cases, the current levels are programmed by bit data d4–d0 entered into the respective Read/Write Current registers 25 as shown in Table 1.

Another important feature of the test modes is the ability to sense and track catastrophic ESD damage (shorts) to the very sensitive, close proximity, MR read heads. A major challenge presented to head manufacturers in using MR heads is electrostatic discharge resulting from the handling of the MR heads and assemblies in which they are contained. ESD damage is one of the most common modes of failure of read/write heads to date. By detecting shorts between the two elements caused by ESD over-stress, head stack assemblies (HSA) can be screened for damaged parts. In addition, changes in the manufacturing process which causes ESD damage can be quickly detected before the heads or HSAs are assembled with the disk drive.

ESD shorts are detected by sensing a low differential resistance between the two MR elements 55 and 60. This is accomplished by measuring the voltage between Rdx and Rdy with equal currents (Ix=Iy) applied in each element, and then repeating the measurement using unequal currents (Ix≠Iy). A zero difference between VRdx-Rdy (with equal currents) and VRdx-VRdy (with unequal currents) may indicate the presence of a short between elements perhaps from ESD damage.

What has been described above are the preferred embodiments for a preamplifier circuit for a computer data storage system wherein multiple test modes enable the preamplifier circuit to electrically test the read/write heads and related circuitry without physically probing. Although the discussion has been focused in reference to testing a single inductive write head element and dual MR read elements, it should be noted again that the present invention test mode functions are equally applicable and effective on other types of head elements and other electrical components and associated circuitry, with certain electrical property exceptions and modifications as obvious to one of ordinary skill in the art. Furthermore, although the present invention description focuses on monitoring a voltage output signal while generating a controlled current, it is equally applicable for monitoring a current output or power output while generating a controlled voltage input, with certain minor component and circuit modifications as obvious to one of ordinary skill in the art. Finally, it will be obvious that the present invention is easily implemented utilizing any of a variety of hardware components existing in the art.

Accordingly, while the present invention has been described by reference to specific embodiments, it will be obvious that other alternative embodiments and methods of implementation or modification may be employed without departing from the true spirit and scope of the invention.

What is claimed is:

1. A preamplifier circuit for a data storage system, the data storage system including at least one read head element and at least one write head element, the preamplifier circuit comprising:

(a) means for forcing a write current generated by preamplifier circuit through the at least one write head element, the write current being responsive to a write data signal received and processed by the preamplifier circuit;

(b) means for presenting a read data signal at an output means of the preamplifier circuit, the read data signal being responsive to a read current generated by the preamplifier circuit through the at least one read head element;

(c) input means for receiving a test mode signal indicative of a test mode for identifying and initiating testing of selected circuitry associate with the preamplifier circuit or the data storage system;

(d) means, electrically connected to the input means, responsive to the test mode signal for initiating a controlled test current in the identified selected circuitry; and, (e) means for presenting an output signal at the output means of the preamplifier circuit, the output signal being responsive to the controlled test current and indicative of electrical properties, including resistance, of the identified selected circuitry.

2. The preamplifier circuit of claim 1 wherein the selected circuitry is selected from the group consisting of the at least one read head element, the at least one write head element, and peripheral circuitry associated with either head element.

3. The preamplifier circuit of claim 2 wherein the at least one read head element is a dual magnetoresistive (MR) head element, and wherein the preamplifier circuit further includes means for initiating, selectively:

(a) equal, controlled test currents in the dual MR elements; and, (b) unequal, controlled test currents in the dual MR elements.

4. The preamplifier circuit of claim 1 wherein the input means includes at least one memory register, for receiving and storing the test mode signal, the register being connected to a communication interface terminal.

5. The preamplifier circuit of claim 1 wherein the means for initiating the controlled test current includes:

(a) at least one memory register for storing a control word indicative of a digital test current signal;

(b) at least one digital to analog converter for converting the digital test current signal to the controlled test current; and, (c) at least one multiplexor for multiplexing the controlled test current to the selected circuitry.

6. The preamplifier circuit of claim 1 wherein the means for presenting an output signal at the output means includes circuitry connecting at least one signal line associated with the selected circuitry to the output means, and wherein the output means includes an electrical contact terminal for each signal line respectively.

7. The preamplifier circuit of claim 1 wherein the output signal is selected from the group consisting of a current, a voltage, and a representation of a current or voltage.

8. A system for electrically testing selected circuitry in a data storage system having a preamplifier circuit, the system comprising:

(a) means for forcing a write current through at least one write head element of the data storage system, the write current being generated by the preamplifier circuit in response to a write data signal received and processed by the preamplifier circuit;

(b) means for sensing a read data signal responsive to a read current generated by the preamplifier circuit through at least one read head element of the data storage system;

(c) input means electrically connected to the preamplifier circuit for receiving a test mode signal indicative of a test mode for identifying and initiating testing of the selected circuitry;

(d) means, electrically connected to the input means, responsive to the test mode signal for initiating a first controlled test current in the identified selected circuitry;

(e) means for sensing a first output signal responsive to the first controlled test current initiated in the identified selected circuitry; and, (f) means for determining an electrical property, including resistance, of the identified selected circuitry based on the first output signal sensed.

9. The system of claim 8 wherein the selected circuitry is selected from the group consisting of the at least one read head element, the at least one write head element, and peripheral circuitry associated with either head element.

10. The system of claim 9 wherein the at least one read head element is a dual magnetoresistive (MR) head element, and wherein the system further includes means for initiating, selectively:

(a) equal, controlled test currents in the dual MR elements; and, (b) unequal, controlled test currents in the dual MR elements.

11. The system of claim 10 further including compare means for comparing a referenced output signal resulting from the equal, controlled test currents, with a referenced output signal resulting from the unequal, controlled test currents.

12. The system of claim 8 wherein the input means includes at least one memory register for receiving and storing the test mode signal, the register being connected to a communication interface terminal.

13. The system of claim 8 wherein the means for initiating the controlled test current includes:

(a) at least one memory register for storing a control word indicative of a digital test current signal;

(b) at least one digital to analog converter for converting the digital test current signal to the controlled test current; and, (c) at least one multiplexor for multiplexing the controlled test current to the selected circuitry.

14. The system of claim 8 wherein the means for sensing a first output signal includes voltmeter or multimeter circuitry means for sensing at least one signal lines associated with the first selected circuitry being tested.

15. The system of claim 8 wherein the electrical property determined further includes a property selected from the group consisting of continuity, electrostatic discharge damage, bond wire connection integrity, solder joint integrity, and peripheral circuitry connection integrity.

16. The system of claim 8 further including:

(a) means for initiating a second controlled test current in the selected circuitry; and (b) compare means for comparing a first resultant electrical property determined from the output signal of the first controlled current with a second resultant electrical property determined from an output signal of the second controlled current.

17. A method for electrically testing selected circuitry in a component of a data storage system, the data storage system having a preamplifier circuit electrically connected to the selected circuitry in the component of the data storage system, and wherein the preamplifier circuit includes input and output signal interface means, the method comprising:

(a) receiving a test mode signal through the input signal interface means of the preamplifier circuit for activating a test mode and for identifying the selected circuitry to be tested;

(b) initiating in response to said test mode signal a first controlled test current in the identified selected circuitry; and, (c) presenting a first output signal at the output signal interface means of the preamplifier circuit for evaluation of an electrical property of the identified selected circuitry, including resistance, the first output signal being responsive to the first controlled test current initiated in the identified selected circuitry, wherein the component of the data storage system is, selectively, a flex assembly, head stack assembly, or head disk assembly.

18. The method of claim 17 wherein the selected circuitry is selected from the group consisting of a disk drive read head element, a write head element, and peripheral circuitry associated with either head element.

19. The method of claim 18 wherein the read head element is a dual magnetoresistive (MR) head element, and wherein the method further includes initiating, selectively:

(a) equal, controlled test currents in the dual MR elements; and, (b) unequal, controlled test currents in the dual MR elements; and further including comparing a first referenced output signal resulting from the equal, controlled test currents, with a second referenced output signal resulting from the unequal, controlled test currents.

20. The method of claim 17 further including initiating a second controlled test current in the selected circuitry, and comparing a first resultant electrical property determined from the first output signal associated with the first controlled test current, with a resultant electrical property determined from a second output signal associated with the second controlled test current.

* * * * *